United States Patent
He

(10) Patent No.: US 10,211,549 B2
(45) Date of Patent: Feb. 19, 2019

(54) ELECTRICAL CONNECTOR

(71) Applicant: LOTES CO., LTD, Keelung (TW)

(72) Inventor: Yin Liang He, Keelung (TW)

(73) Assignee: LOTES CO., LTD, Keelung (TW)

( * ) Notice: Subject to any disclaimer, the term of this patent is extended or adjusted under 35 U.S.C. 154(b) by 0 days.

(21) Appl. No.: 15/869,576

(22) Filed: Jan. 12, 2018

(65) Prior Publication Data

US 2018/0342820 A1 Nov. 29, 2018

Related U.S. Application Data

(60) Provisional application No. 62/511,030, filed on May 25, 2017.

(30) Foreign Application Priority Data

Aug. 28, 2017 (CN) .......................... 2017 1 0748636

(51) Int. Cl.
| | |
|---|---|
| H01R 12/52 | (2011.01) |
| H01R 12/88 | (2011.01) |
| H05K 7/12 | (2006.01) |
| H05K 7/10 | (2006.01) |
| H01R 13/629 | (2006.01) |
| H01R 12/70 | (2011.01) |

(52) U.S. Cl.
CPC ............. *H01R 12/52* (2013.01); *H01R 12/88* (2013.01); *H01R 13/62933* (2013.01); *H05K 7/1061* (2013.01); *H05K 7/12* (2013.01); *H01R 12/7076* (2013.01)

(58) Field of Classification Search
CPC .. H01R 12/52; H01R 13/62933; H01R 12/88; H01R 12/7076; H05K 7/1061; H05K 7/12
See application file for complete search history.

(56) References Cited

U.S. PATENT DOCUMENTS

| 8,979,566 B2 | 3/2015 | Yeh |
| 2003/0169160 A1* | 9/2003 | Rodriguez Barros ...................... B60Q 1/2665 340/426.1 |

(Continued)

FOREIGN PATENT DOCUMENTS

| CN | 103490208 A | 1/2014 |
| CN | 204885572 U | 12/2015 |
| CN | 205081251 U | 3/2016 |

*Primary Examiner* — Truc T Nguyen
(74) *Attorney, Agent, or Firm* — Locke Lord LLP; Tim Tingkang Xia, Esq.

(57) ABSTRACT

An electrical connector includes an insulating body. Multiple terminals are accommodated in the insulating body. A base is located at a periphery of the insulating body and provided with a first pivoting portion and a second pivoting portion, both located behind the insulating body. A guide frame is pivotally connected to the first pivoting portion, so that the guide frame rotates between a closed position and an open position relative to the base. The guide frame is provided with a limiting section, and two sliding rails are arranged at left and right sides thereof correspondingly. A carrier is supported on upper surfaces of the slide rails, slides in the sliding rails and rotates along with the guide frame. When the guide frame rotates from the closed position to the open position, an engaging portion abuts the limiting section to limit the guide frame from continuing rotating.

14 Claims, 12 Drawing Sheets

(56) References Cited

U.S. PATENT DOCUMENTS

| | | | |
|---|---|---|---|
| 2009/0258513 A1* | 10/2009 | Wu | H01R 13/629 439/78 |
| 2010/0006650 A1* | 1/2010 | Auboussier | G06K 19/077 235/439 |
| 2015/0192253 A1* | 7/2015 | Zhang | F21S 8/00 362/235 |
| 2017/0005425 A1* | 1/2017 | Zhang | G06F 1/00 |
| 2017/0095667 A1* | 4/2017 | Yakovlev | A61N 1/36125 |
| 2018/0212387 A1* | 7/2018 | Peng | H01R 12/88 |
| 2018/0361555 A1* | 12/2018 | Miaowu | B25F 3/00 |

* cited by examiner

ELECTRICAL CONNECTOR

CROSS-REFERENCE TO RELATED PATENT APPLICATION

This application claims priority to and the benefit of, pursuant to 35 U.S.C. § 119(e), U.S. provisional patent application Ser. No. 62/511,030 filed May 25, 2017. This application also claims priority to and benefit of, under 35 U.S.C. § 119(a), Patent Application No. 201710748636.3 filed in P.R. China on Aug. 28, 2017. The entire contents of the above-identified applications are incorporated herein in their entireties by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present invention relates to an electrical connector, and more particularly to an electrical connector for being electrically connected with a chip module.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

The Chinese Patent Application No. CN201520471305.0 discloses an electrical connector, which includes an insulating body, multiple terminals, a base, a pressing plate, a guide member and a carrier. The terminals are accommodated in the insulating body. The base is located at the periphery of the insulating body and provided with a first metal sheet and a second metal sheet, and the first metal sheet and the second metal sheet are located on the same side of the insulating body. The pressing plate is pivotally connected to the second metal sheet and arranged above the insulating body in a covering mode. The guide member is pivotally connected to the first metal sheet, located between the base and the pressing plate and provided with two sliding rails which are arranged in pair. The carrier is used for carrying a chip module onto the insulating body, and is supported on the two sliding rails and slides along the sliding rails. The carrier is assembled to the guide member, so that the chip module is driven to be connected with or disconnected from the terminals when the guide member rotates between an open state and a closed state.

However, the first metal sheet and the second metal sheet are located on the same side of the insulating body, and the guide member is located between the base and the pressing plate. Thus, when rotating into the open state, the guide member inevitably impacts the pressing plate. Accordingly, the chip module impacts the pressing plate, and the risk of crashing of the chip module is increased.

Therefore, a heretofore unaddressed need to design an improved electrical connector exists in the art to address the aforementioned deficiencies and inadequacies.

SUMMARY

In view of the problem addressed in the background technology, an objective of the present invention is to provide an electrical connector capable of avoiding excessive rotation of a guide frame, so as to further prevent a chip module from impacting a pressing plate.

To achieve the foregoing objective, the present invention adopts the following technical solutions. The electrical connector is configured to be electrically connected with a chip module, and includes: an insulating body; a plurality of terminals accommodated in the insulating body, and configured to be electrically connected with the chip module; a base located at a periphery of the insulating body, and provided with a first pivoting portion and a second pivoting portion both located behind the insulating body, wherein the first pivoting portion is located between the second pivoting portion and the insulating body; a pressing plate configured to press the chip module, and pivotally connected to the second pivoting portion; a guide frame pivotally connected to the first pivoting portion, so that the guide frame rotates between a closed position and an open position relative to the base, wherein the guide frame is provided with a limiting section, two sliding rails are respectively located on a left side and a right side of the guide frame; a carrier located between the pressing plate and the guide frame, configured to carry the chip module onto the insulating body, wherein the carrier is slidably assembled in the sliding rails and rotates along with the guide frame; and an engaging portion located behind the limiting section, wherein when the guide frame rotates from the closed position to the open position, the engaging portion abuts the limiting section to limit the guide frame from continuing rotating.

In certain embodiments, the limiting section has an arc surface, and when the guide frame is located in the open position, the engaging portion abuts the arc surface.

In certain embodiments, a width of the limiting section in a left-right direction is greater than a width of the engaging portions in the left-right direction.

In certain embodiments, the guide frame comprises a plastic member and a metal member insert-molded in the plastic member; the plastic member is provided with a rear arm and two side arms formed by extending forward from two opposite sides of the rear arm, and the sliding rails are arranged on the side arms; a pivoting base is formed by extending backward from the rear arm, and the pivoting base is pivotally connected to the first pivoting portion; the limiting section protrudes upward from a top surface of the pivoting base; and the metal member is provided with two opposite first arms, and a second arm and a third arm respectively connected with the two first arms, the first arms are insert-molded in the side arms and extend out of the side arms in a length direction of the first arms, the second arm is insert-molded in the rear arm, and the third arm bends downward from the first arms so as to space away from the carrier when the carrier is assembled to the guide frame.

In certain embodiments, the base is provided with two vertical first stopping sheets, each of the first stopping sheets is provided with a first through hole, the first pivoting portion penetrates through the two first through holes, and the pivoting base is located between the two first stopping sheets, so that the two first stopping sheets limit a left-right movement of the guide frame, and when the guide frame is located in the closed position, a height of an upper edge of each of the first stopping sheets is between a height of a top surface of the pivoting base and a height of a top surface of the limiting section.

In certain embodiments, the base comprises a base plate surrounding the periphery of the insulating body and a metal sheet located behind the insulating body, the second pivoting portion is assembled to the metal sheet, and the engaging portion is arranged on the metal sheet.

In certain embodiments, the metal sheet is provided with a flat plate portion fixed to the base plate, the flat plate portion is located behind the first pivoting portion, and a front edge of the flat plate portion vertically bends and extends upward to form the engaging portion.

In certain embodiments, the metal sheet is provided with two second stopping sheets formed by vertically extending upward; the two second stopping sheets are located behind the engaging portions; each of the second stopping sheets is provided with a second through hole, and the second pivoting portion penetrates through the two second through holes; the pressing plate is provided with a bending portion pivotally connected to the second pivoting portion and located between the two second stopping sheets, so that the two second stopping sheets limit a left-right movement of the pressing plate; and two position limiting sheets are formed by bending and extending opposite to each other from rear edges of the second stopping sheets, the position limiting sheets are located behind the bending portion, and when the pressing plate is opened, the position limiting sheets abut the bending portion.

In certain embodiments, when the engaging portion abuts the limiting section, an angle between the guide frame and the insulating body is between 45 degrees and 90 degrees.

In certain embodiments, the base comprises the base plate surrounding the periphery of the insulating body and a metal sheet located behind the insulating body, the first pivoting portion is assembled to the metal sheet, a groove is downward concavely formed on the metal sheet, a torsion spring is sleeved over the first pivoting portion, and the torsion spring is provided with a first abutting portion abutting the guide frame and a second abutting portion downward abutting the groove.

Compared with the related art, the present invention has the following beneficial effects:

When the guide frame rotates from the closed position to the open position, the engaging portion abuts the limiting section to limit the guide frame from continuing rotating, thus preventing the guide frame from rotating excessively and impacting the pressing plate, and thereby avoiding the risk of the chip module impacting the pressing plate and being damaged. In addition, the engaging portion stops the limiting section, so that a gap exists between the guide frame and the pressing plate, allowing the carrier to slide out of the sliding rails and the chip module to be taken down conveniently.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

Figure 1:
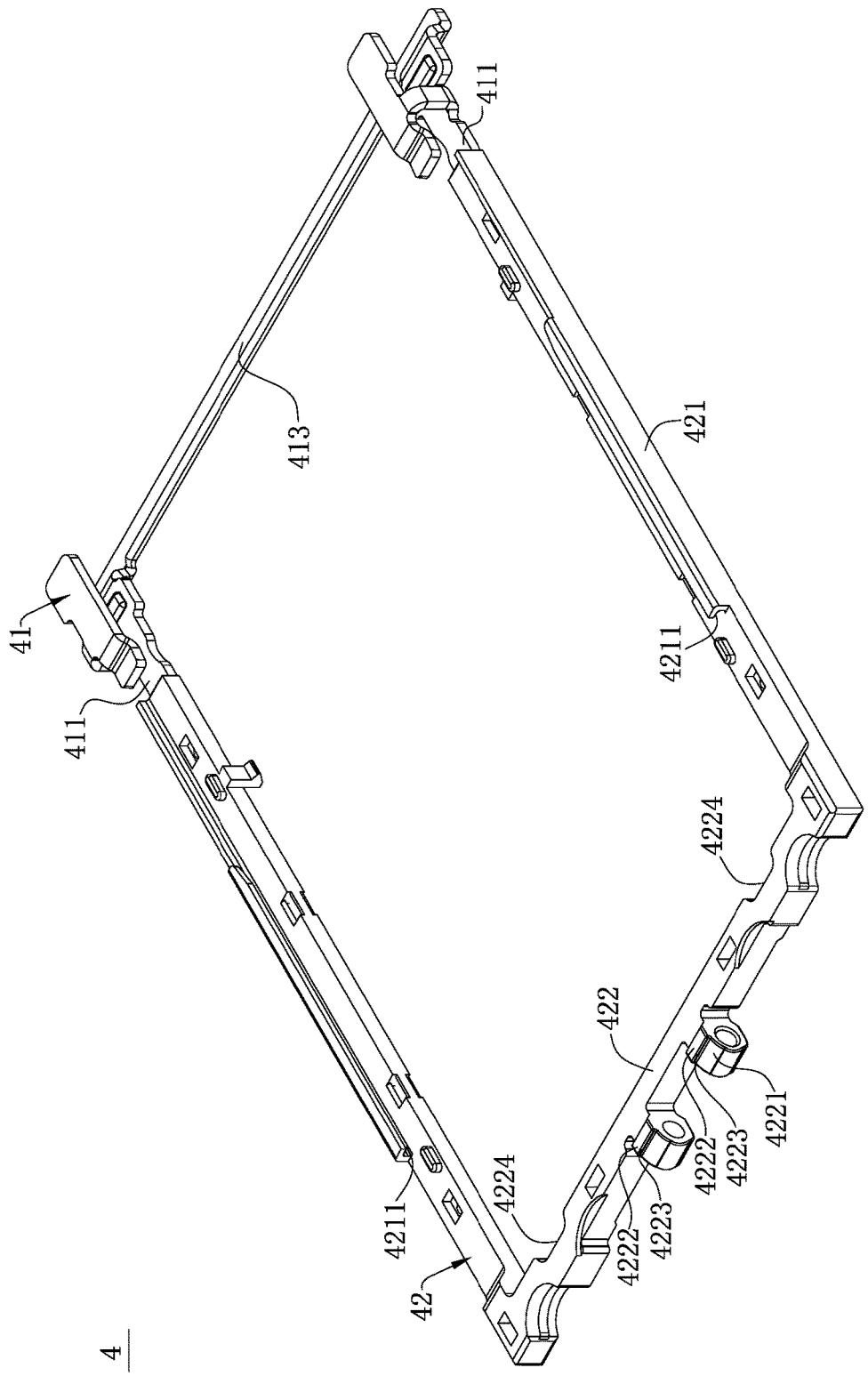
FIG. 1 is a perspective view of a guide frame of an electrical connector according to certain embodiments of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-12. In accordance with the purposes of this invention, as embodied and broadly described herein, this invention, in one aspect, relates to an electrical connector.

Figure 2:
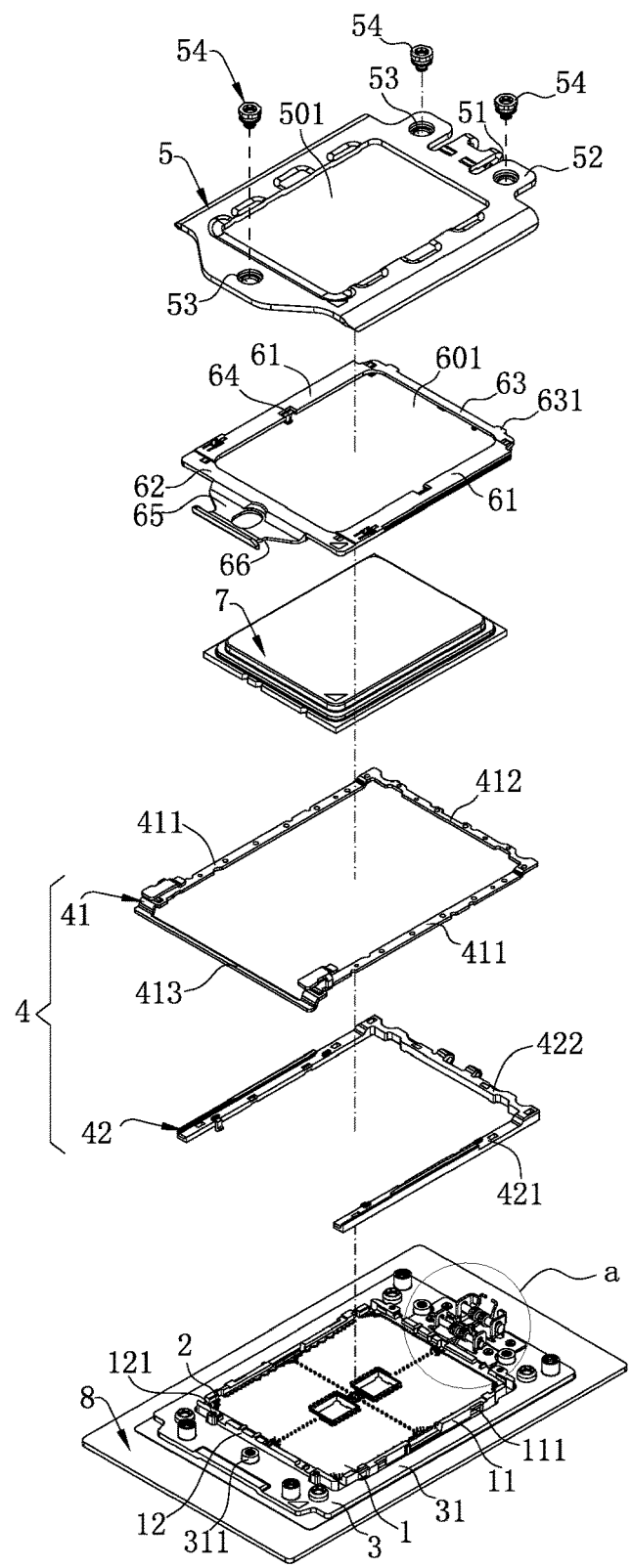
FIG. 2 is a perspective exploded view of an electrical connector according to certain embodiments of the present invention.
Figure 4:
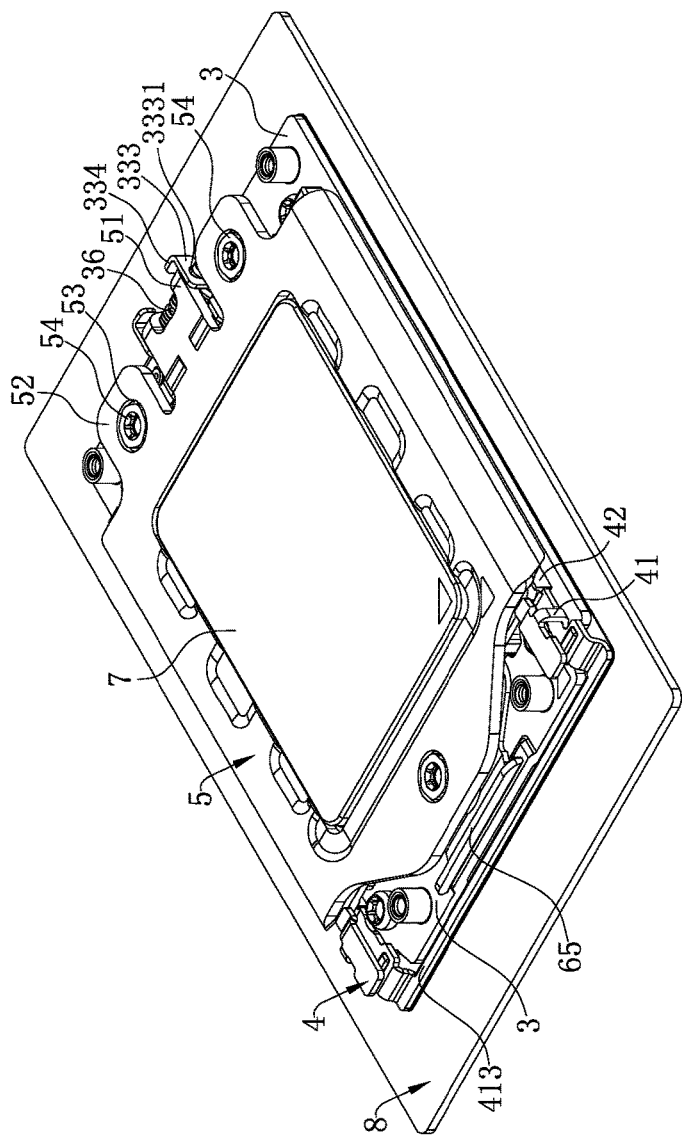
FIG. 4 is a perspective assembled view of the electrical connector according to certain embodiments of the present invention.

As shown in FIG. 2 and FIG. 4, an electrical connector according to certain embodiments of the present invention is used for electrically connecting a chip module 7 to a circuit board 8. The electrical connector includes an insulating body 1; multiple terminals 2 accommodated in the insulating body 1 and conductively connecting the chip module 7 to the circuit board 8; a base 3 fixed to the circuit board 8 and located at a periphery of the insulating body 1; a guide frame 4 and a pressing plate 5 respectively pivotally connected to the base 3; and a carrier 6 used for carrying the chip module 7 to the insulating body 1. The carrier 6 is assembled to the guide frame 4 and rotates along with the guide frame 4.

As shown in FIG. 2, the insulating body 1 is substantially rectangular, and has two first side walls 11 respectively arranged at the left and right sides thereof and two second side walls 12 respectively arranged at the front and rear sides thereof. The second side walls 12 are connected with the first side walls 11. An outer surface of each of the first side walls 11 is concavely provided with a recess portion 111. Each of the second side walls 12 is provided with two positioning holes 121, and the positioning holes 121 penetrate through the second side wall 12 vertically.

Figure 3:
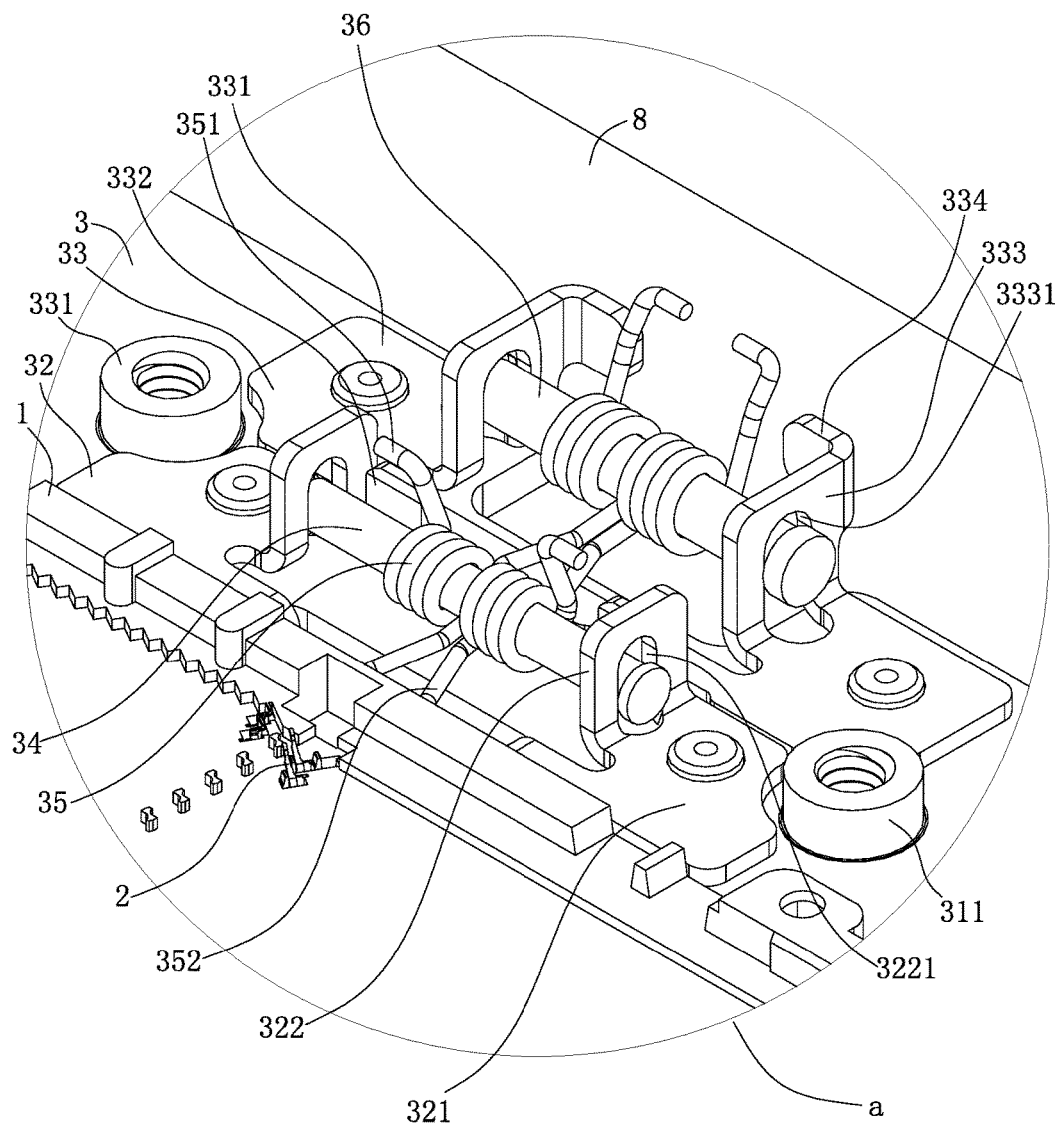
FIG. 3 is an enlarged view of a portion a in FIG. 2.

As shown in FIG. 2 and FIG. 3, the base 3 includes a base plate 31 and a first metal sheet 32 and a second metal sheet 33 riveted to the base plate 31. The base plate 31 surrounds the periphery of the insulating body 1, and is provided with three locking portions 311. Two of the locking portions 311 are located behind the insulating body 1, and the other locking portion 311 is located in front of the insulating body 1. The first metal sheet 32 and the second metal sheet 33 are both located behind the insulating body 1, and the first metal sheet 32 is located in front of the second metal sheet 33. In other embodiments, the first metal sheet 32 and the second metal sheet 33 can be integrally formed, and the positions and number of the locking portions 311 can be adjusted according to practical demands and are not limited herein.

Figure 9:
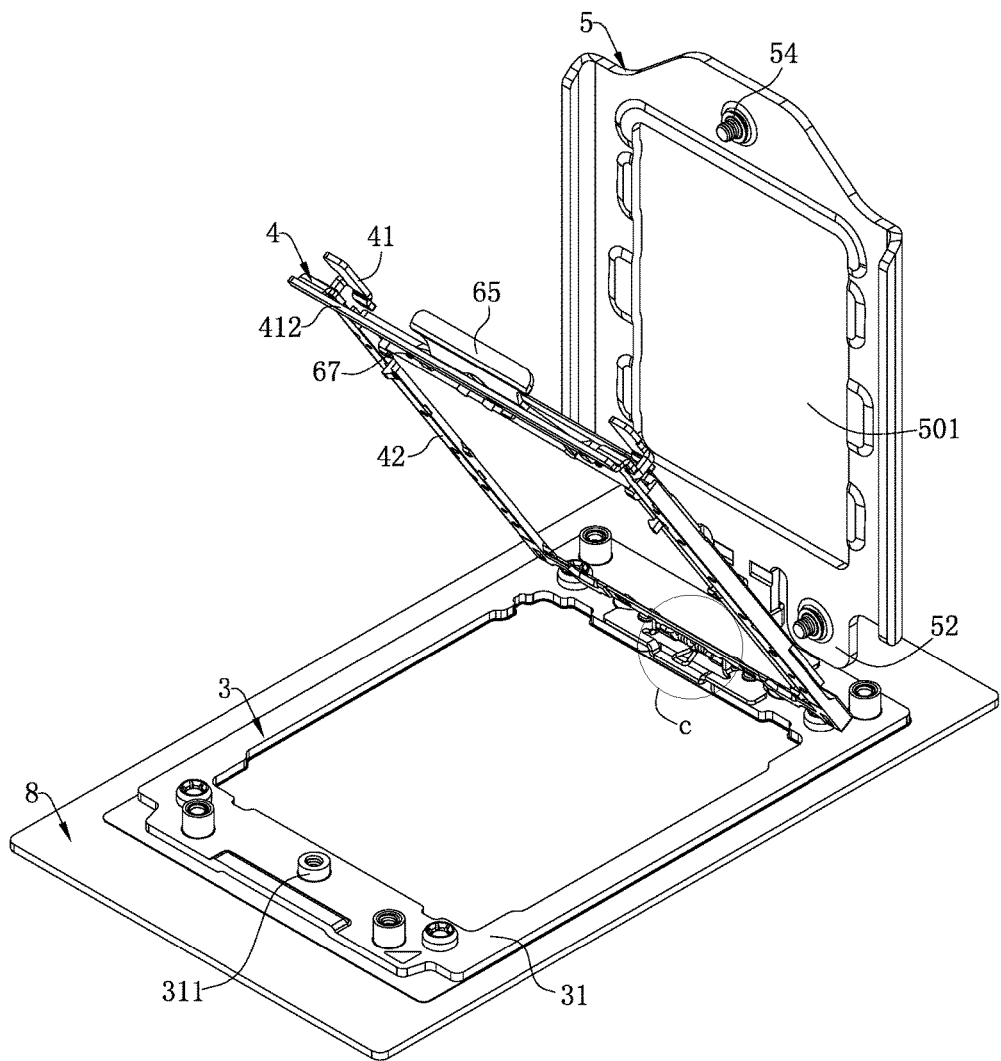
FIG. 9 is a perspective view of the electrical connector according to certain embodiments of the present invention without an insulating body and the press frame and the guide frame are in the open positions.
Figure 10:
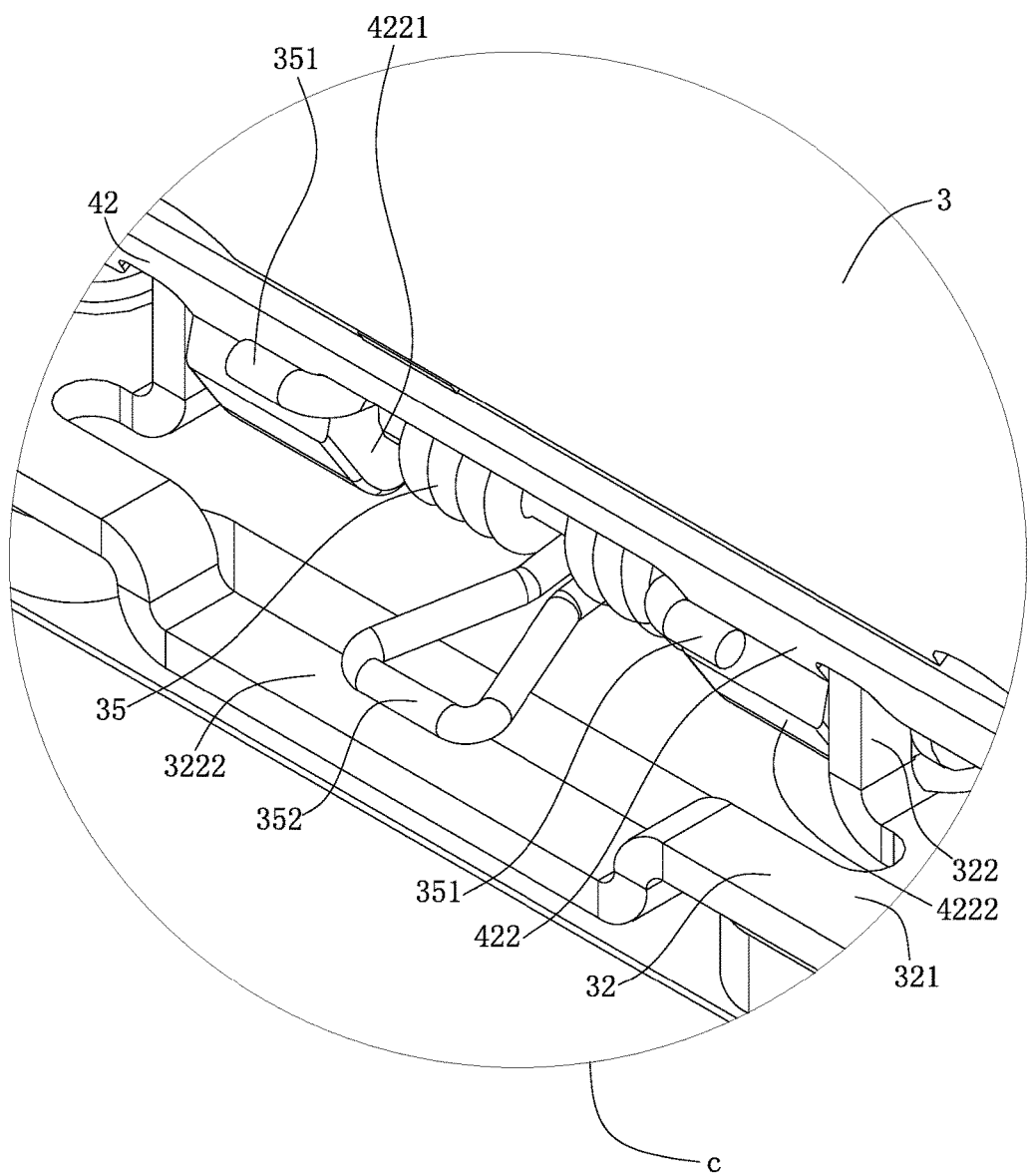
FIG. 10 is an enlarged view of a portion c in FIG. 9.

The first metal sheet 32 is provided with a first flat plate portion 321 riveted to the base plate 31. The first flat plate portion 321 extends vertically upward to form two first stopping sheets 322. Each first stopping sheet 322 is provided with a first through hole 3221. A first pivoting portion 34 penetrates through the two first through holes 3221. A torsion spring 35 is sleeved over the first pivoting portion 34, and the torsion spring 35 is provided with a first abutting portion 351 and a second abutting portion 352. As shown in FIG. 9 and FIG. 10, the first flat plate portion 321 is further downward concavely provided with a groove 3222. The first abutting portion 351 abuts the guide frame 4, and the second abutting portion 352 downward abuts against the groove 3222, so as to buffer a downward movement of the guide frame 4, and prevent the guide frame 4 from sharply dropping and causing the terminals 2 to be smashed up by the chip module 7.

The second metal sheet 33 is provided with a second flat plate portion 331 riveted to the base plate 31, and the second flat plate portion 331 is located behind the first pivoting portion 34. A front edge of the second flat plate portion 331 vertically bends and extends upward to form two engaging portions 332, so that the two engaging portions 332 are simple in structure and easy to form, and the production cost of the electrical connector is reduced. Further, the two engaging portions 332 enter between the two first stopping sheets 322, so that the first metal sheet 32 and the second metal sheet 33 are closely arranged, and therefore, the whole electrical connector device mechanism is compact in structure. The second flat plate portion 331 vertically bends and extends upward to form two second stopping sheets 333 opposite to each other left and right, and the second stopping sheets 333 are located behind the engaging portions 332; and two position limiting sheets 334 are formed by bending and extending opposite to each other from rear edges of the two second stopping sheets 333. Each second stopping sheet 333 is provided with a second through hole 3331, and a second pivoting portion 36 penetrates through the two second through holes 3331.

Figure 5:
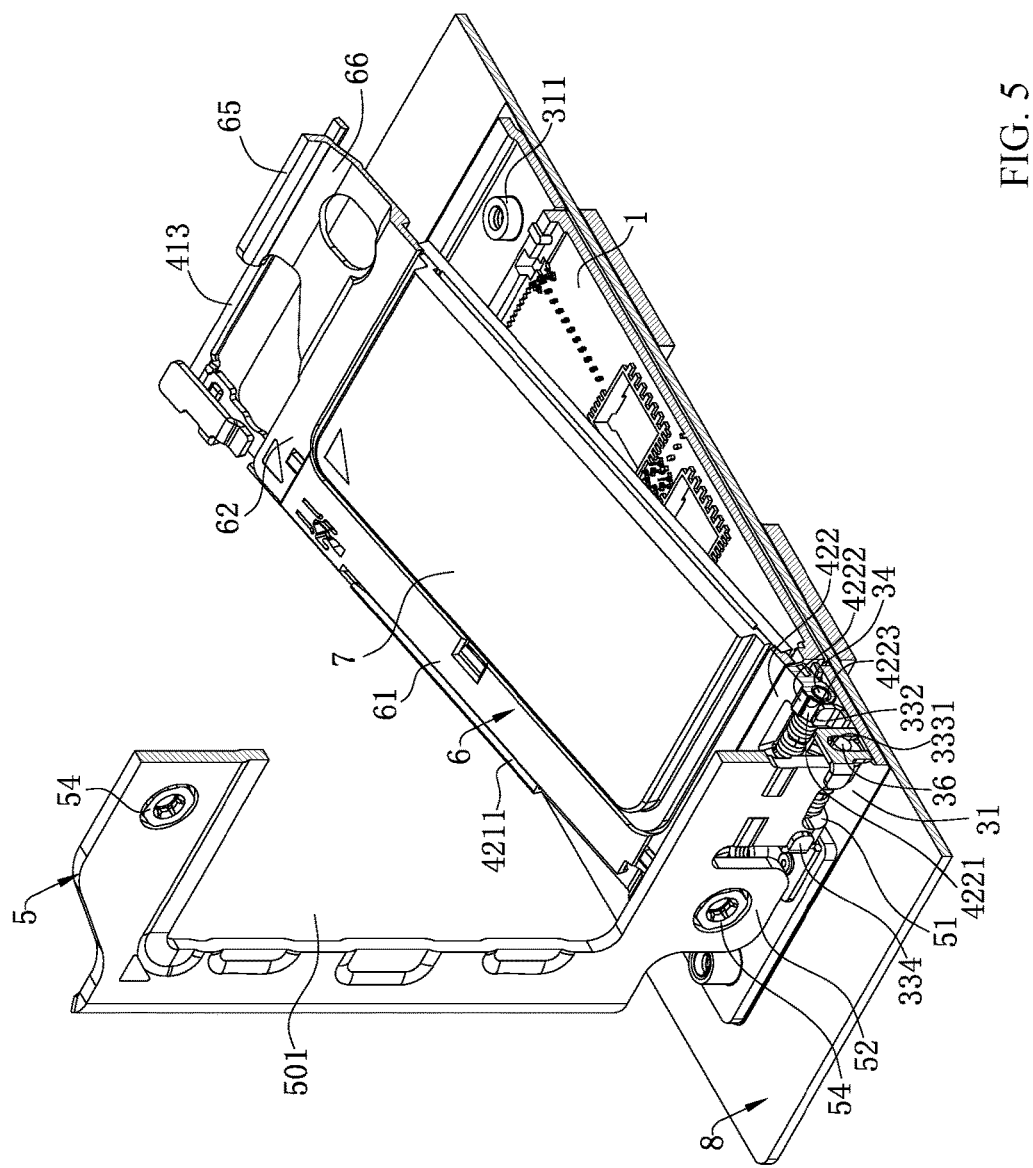
FIG. 5 is a perspective sectional view of the electrical connector according to certain embodiments of the present invention, where a press frame is in an open position and a guide frame is not fully opened.
Figure 6:
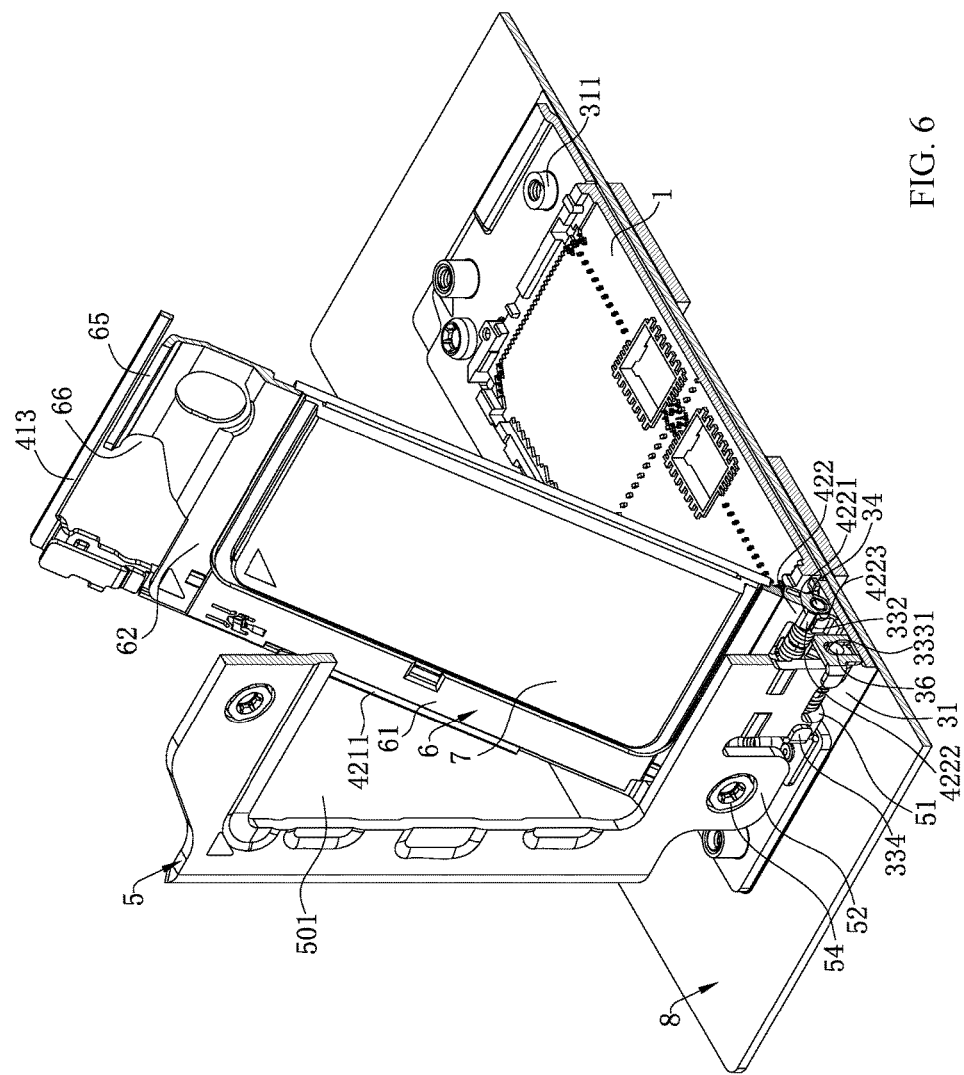
FIG. 6 is a perspective sectional view of the electrical connector according to certain embodiments of the present invention, where the press frame and the guide frame are in open positions.

As shown in FIG. 2 and FIG. 4, the pressing plate 5 is made from a metal material. A perforated hole 501 is formed at the center of the pressing plate 5 to allow the chip module 7 to pass therethrough. Two bending portions 51 are provided at a rear end of the pressing plate 5, pivotally connected to the second pivoting portion 36, and located between the two second stopping sheets 333, so that the two second stopping sheets 333 limit a left-right movement of the pressing plate 5 during rotation. In addition, the bending portions 51 are located in front of the position limiting sheets 334. As shown in FIG. 5 and FIG. 6, when the pressing plate 5 is located in an open position, the position limiting sheets 334 abut the bending portions 51, thus avoiding excessive rotation of the pressing plate 5. Further, the pressing plate 5 is provided with two protruding portions 52 at positions on two opposite sides of the bending portions 51. The pressing plate 5 is provided with three combining holes 53 corresponding to the three locking portions 311. One of the combining holes 53 is located in front of the perforated hole 501, and the other two of the combining holes 53 are located behind the perforated hole 501 and formed in the protruding portions 52. A locking member 54 penetrates through each of the combining holes 53 to be locked to the locking portions 311, so as to fix the pressing plate 5 to the base plate 31. In this embodiment, the locking member 54 is a screw.

As shown in FIG. 2 and FIG. 9, the carrier 6 is made from a plastic material. Two side plates 61 are arranged on two opposite sides of the carrier 6. The carrier 6 is further provided with a front plate 62 and a rear plate 63 connected with the two side plates 61. The two side plates 61, the front plate 62 and the rear plate 63 define an accommodating hole

601 to allow the chip module 7 to pass therethrough. A rear end of the rear plate 63 is horizontally protrudingly provided with two protruding blocks 631. The carrier 6 is provided with four positioning portions 67 corresponding to the four positioning holes 121. Two of the positioning portions 67 are arranged on the lower surfaces of the protruding blocks 631, and the other two of the positioning portions 67 are arranged on a lower surface of the front plate 62. The positioning portions 67 are cylinders with large top ends and small lower ends, and the positioning portions 67 are matched with the positioning holes 121 so as to position the carrier 6 to the insulating body 1. The carrier 6 is provided with six clamping hooks 64 clamped to a bottom surface of the chip module 7, so as to fix the chip module 7 to the carrier 6. The carrier 6 is further provided with a grasping portion 65 protrudingly extending forward from the front plate 62. Grasping spaces 66 are arranged on two sides of the grasping portion 65, so as to facilitate an operation by an operator.

Figure 7:
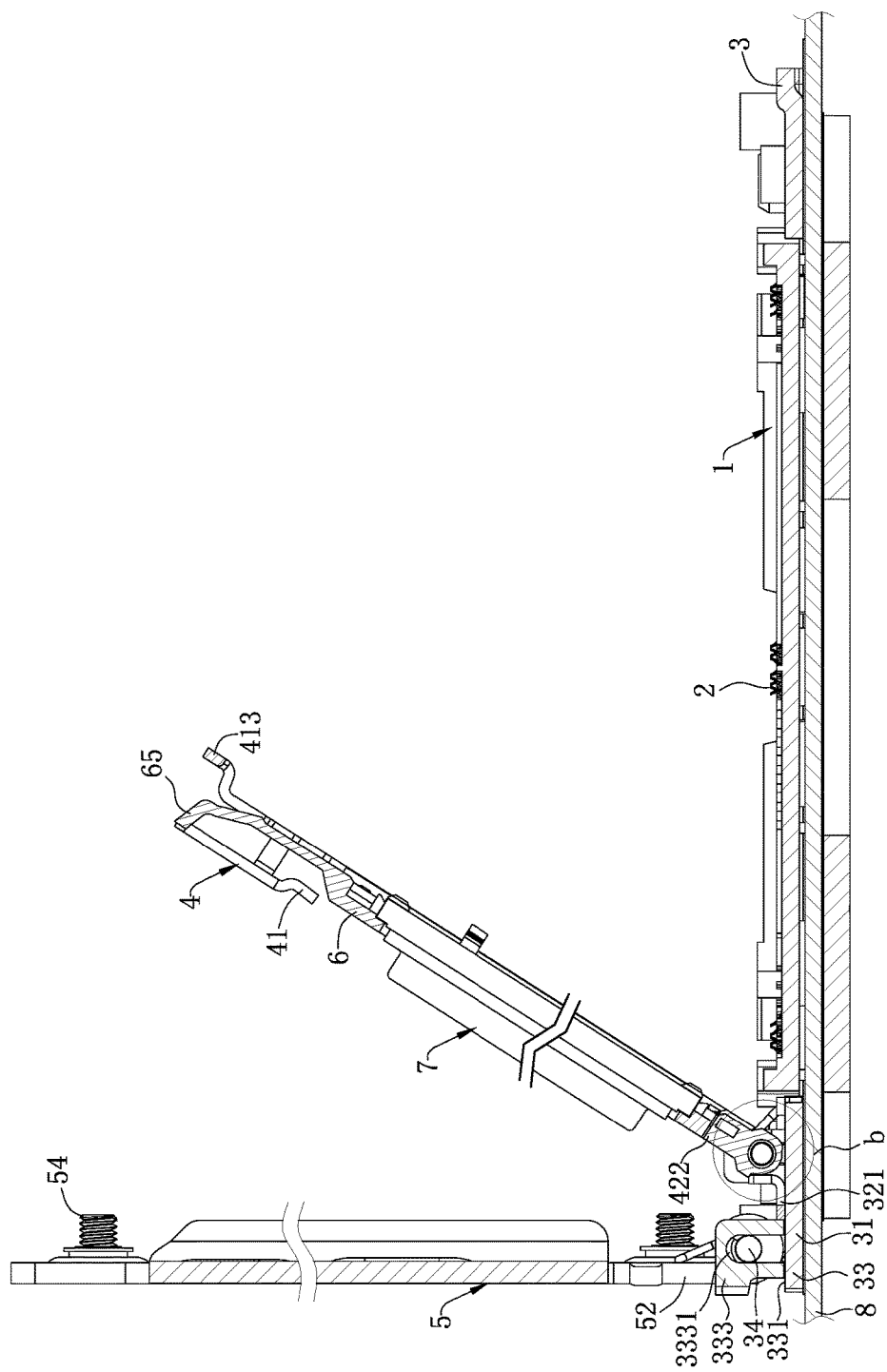
FIG. 7 is a sectional view of the electrical connector according to certain embodiments of the present invention, where the press frame and the guide frame are in the open positions.
Figure 8:
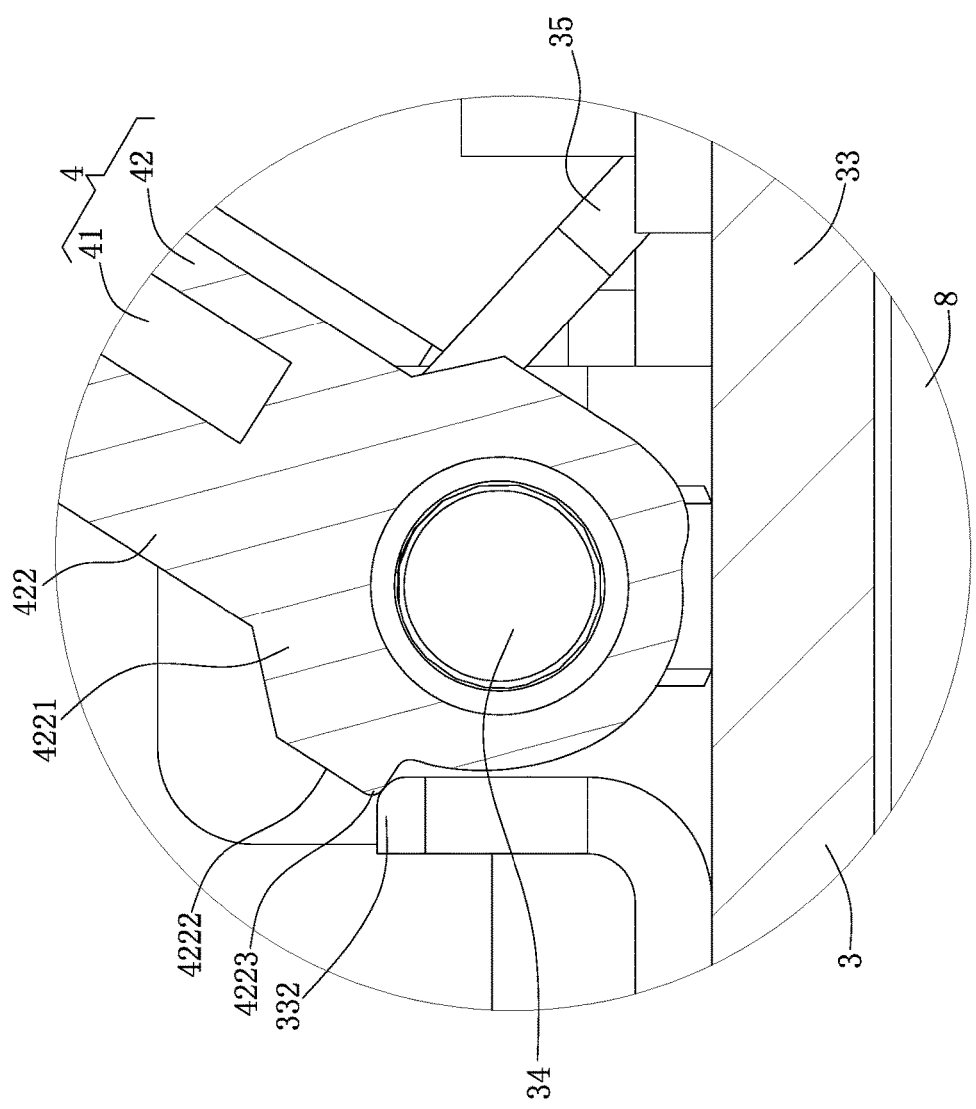
FIG. 8 is an enlarged view of a portion b in FIG. 7.
Figure 11:
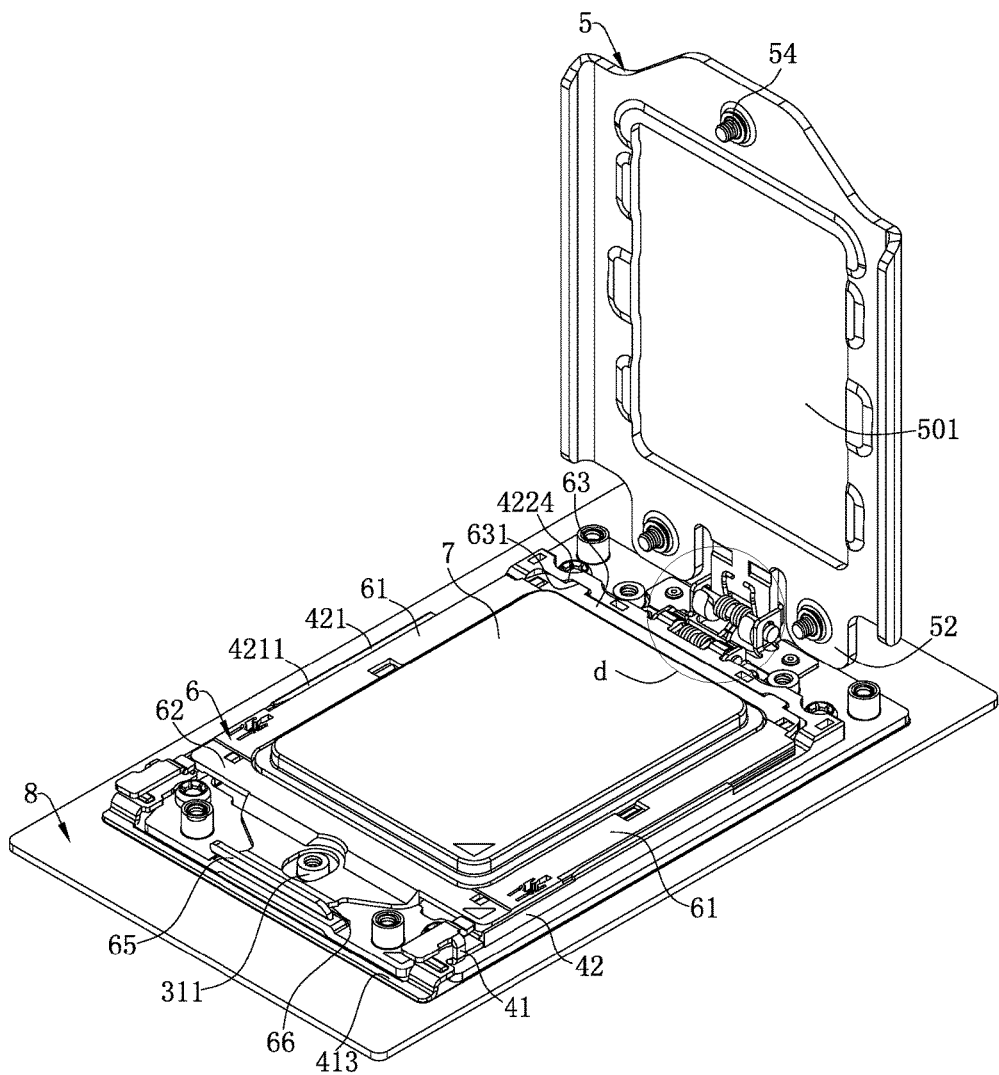
FIG. 11 is a perspective view of the electrical connector according to certain embodiments of the present invention, where the press frame is in the open position and the guide frame is in a closed position.
Figure 12:
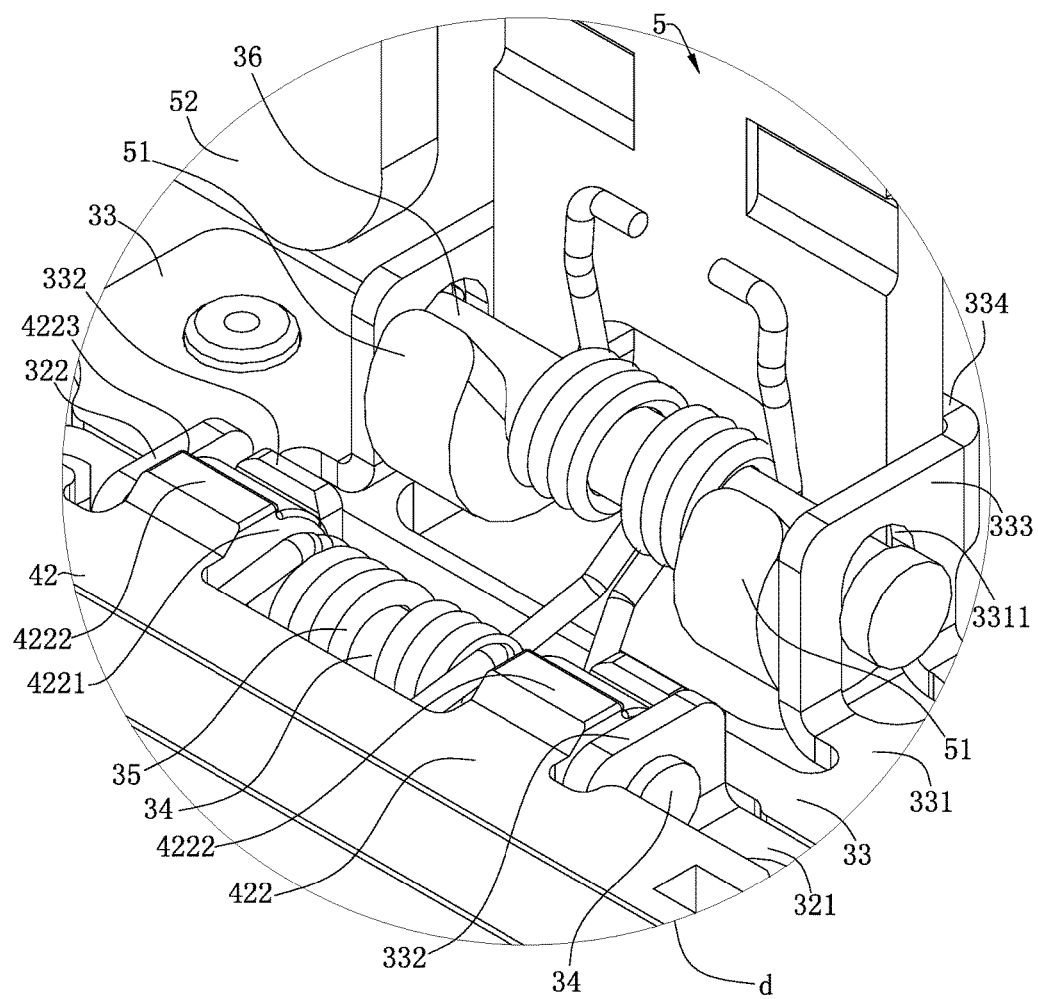
FIG. 12 is an enlarged view of a portion d in FIG. 11.

As shown in FIG. 1, FIG. 6 and FIG. 7, the guide frame 4 includes a plastic member 42 and a metal member 41 insert-molded in the plastic member 42 so as to enhance the strength of the plastic member 42. The plastic member 42 is substantially U-shaped, and the plastic member 42 is provided with a rear arm 422 and two side arms 421 formed by extending forwards from two opposite sides of the rear arm 422. The two side arms 421 are respectively provided with sliding rails 4211. The two sliding rails 4211 are located on two opposite sides of the insulating body 1 respectively. The two side plates 61 are assembled to the two sliding rails 4211 correspondingly, so that the carrier 6 slides on the guide frame 4. Two pivoting bases 4221 are formed by extending backward from the rear arm 422, and the two pivoting bases 4221 are pivotally connected to the first pivoting portion 34. Further, as shown in FIG. 12, the two pivoting bases 4221 are located between the two first stopping sheets 322, so that the two first stopping sheets 322 stop the two pivoting bases 4221 in a left-right direction respectively, preventing the guide frame 4 from swinging left and right during rotation. A limiting section 4222 is protrudingly provided at each of the pivoting bases 4221. When the guide frame 4 is located in the open position, the engaging portions 332 abut the limiting sections 4222 to limit the guide frame 4 from continuing rotating, thus preventing the guide frame 4 from impacting the pressing plate 5 during rotation, and thereby avoiding the risk of the chip module 7 impacting the pressing plate 5 and being damaged. In addition, a gap can be reserved between the guide frame 4 and the pressing plate 5, allowing the carrier 6 to slide out of the sliding rails 4211 conveniently and the chip module 7 to be taken down conveniently. Preferably, each limiting section 4222 is provided with an arc surface 4223. When the guide frame 4 is located in the open position, the engaging portions 332 abut the arc surfaces 4223, so that abrasion to the limiting sections 4222 is reduced, and the service life of the electrical connector is prolonged. A width of each of the limiting sections 4222 in the left-right direction is greater than a width of each of the engaging portions 332 in the left-right direction, so that it can be guaranteed that the engaging portions 332 abut the limiting sections 4222 stably, thereby avoiding the failure of limiting functions of the limiting sections 4222 due to dislocation of the engaging portions 332 and the limiting sections 4222. As shown in FIG. 11 and FIG. 12, the guide frame 4 is located in a closed position, the height of an upper edge of each of the first stopping sheets 322 is between the height of each of the top surfaces of the pivoting bases 4221 and the height of each of the top surfaces of the limiting sections 4222. Thus, it is guaranteed that the two first stopping sheets 322 have larger side surface areas to stop the pivoting bases 4221, and the limiting sections 4222 are high enough, so that the area of the arc surfaces 4223 is increased, and the abutting reliability between the limiting sections 4222 and the engaging portions 332 is improved. In addition, the rear arm 422 is concavely provided with two reserved slots 4224 to reserve for the protruding blocks 631.

The metal member 41 is provided with two opposite first arms 411, and a second arm 412 and a third arm 413 which are respectively connected with the two first arms 411. The first arms 411 are insert-molded in the side arms 421 and extend out of the side arms 421 in a length direction of the first arms 411. The second arm 412 is insert-molded in the rear arm 422. The third arm 413 bends downward from the first arms 411 so as to reserve for the carrier 6 when the carrier 6 is assembled to the guide frame 4.

As shown in FIG. 6 and FIG. 7, in this embodiment, when the guide frame 4 is located in the open position, the engaging portions 332 abut the limiting sections 4222, and an angle between the guide frame 4 and the insulating body 1 is about 60 degrees. Thus, the chip module 7 can be taken out conveniently. In other embodiments, the angle may be between 45 degrees and 90 degrees, and is not limited herein.

To sum up, the electrical connector according to certain embodiments of the present invention has the following beneficial effects:

(1) When the guide frame 4 rotates from the closed position to the open position, the engaging portions 332 abut the limiting sections 4222 to limit the guide frame 4 from continuing rotating, thus preventing the guide frame 4 from impacting the pressing plate 5 during rotation, and thereby avoiding the risk of the chip module 7 impacting the pressing plate 5 and being damaged. Furthermore, a gap is reserved between the guide frame 4 and the pressing plate 5, allowing the carrier 6 to slide out of the sliding rails 4211 conveniently and the chip module 7 to be taken down conveniently.

(2) The second metal sheet 33 is provided with a second flat plate portion 331 fixed to the base plate 31, and the second flat plate portion 331 is located behind the first pivoting portion 34. A front edge of the second flat plate portion 331 vertically bends and extends upward to form two engaging portions 332, so that the two engaging portions 332 are simple in structure and easy to form, and the production cost of the electrical connector is reduced.

(3) Each limiting section 4222 is provided with an arc surface 4223. When the guide frame 4 is located in the open position, the engaging portions 332 abut the arc surfaces 4223, so that abrasion to the limiting sections 4222 is reduced, and the service life of the electrical connector is prolonged.

(4) A width of each of the limiting sections 4222 in the left-right direction is greater than a width of each of the engaging portions 332 in the left-right direction, so that it can be guaranteed that the engaging portions 332 abut the limiting sections 4222 stably, thereby avoiding the failure of limiting functions of the limiting sections 4222 due to dislocation of the engaging portions 332 and the limiting sections 4222.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector, configured to be electrically connected with a chip module, comprising:
    an insulating body;
    a plurality of terminals accommodated in the insulating body, and configured to be electrically connected with the chip module;
    a base located at a periphery of the insulating body, and provided with a first pivoting portion and a second pivoting portion both located behind the insulating body, wherein the first pivoting portion is located between the second pivoting portion and the insulating body;
    a pressing plate configured to press the chip module, and pivotally connected to the second pivoting portion;
    a guide frame pivotally connected to the first pivoting portion, so that the guide frame rotates between a closed position and an open position relative to the base, wherein the guide frame is provided with a limiting section,
    two sliding rails are respectively located on a left side and a right side of the guide frame;
    a carrier located between the pressing plate and the guide frame, configured to carry the chip module onto the insulating body, wherein the carrier is slidably assembled in the sliding rails and rotates along with the guide frame; and
    an engaging portion located behind the limiting section, wherein when the guide frame rotates from the closed position to the open position, the engaging portion abuts the limiting section to limit the guide frame from continuing rotating,
    wherein the limiting section has an arc surface, and when the guide frame is located in the open position, the engaging portion abuts the arc surface.

2. The electrical connector according to claim 1, wherein a width of the limiting section in a left-right direction is greater than a width of the engaging portions in the left-right direction.

3. The electrical connector according to claim 1, wherein:
    the guide frame comprises a plastic member and a metal member insert-molded in the plastic member;
    the plastic member is provided with a rear arm and two side arms formed by extending forward from two opposite sides of the rear arm, and the sliding rails are arranged on the side arms;
    a pivoting base is formed by extending backward from the rear arm, and the pivoting base is pivotally connected to the first pivoting portion;
    the limiting section protrudes upward from a top surface of the pivoting base; and
    the metal member is provided with two opposite first arms, and a second arm and a third arm respectively connected with the two first arms, the first arms are insert-molded in the side arms and extend out of the side arms in a length direction of the first arms, the second arm is insert-molded in the rear arm, and the third arm bends downward from the first arms so as to space away from the carrier when the carrier is assembled to the guide frame.

4. The electrical connector according to claim 3, wherein the base is provided with two vertical first stopping sheets, each of the first stopping sheets is provided with a first through hole, the first pivoting portion penetrates through the two first through holes, and the pivoting base is located between the two first stopping sheets, so that the two first stopping sheets limit a left-right movement of the guide frame, and when the guide frame is located in the closed position, a height of an upper edge of each of the first stopping sheets is between a height of a top surface of the pivoting base and a height of a top surface of the limiting section.

5. An electrical connector, configured to be electrically connected with a chip module, comprising:
    an insulating body;
    a plurality of terminals accommodated in the insulating body, and configured to be electrically connected with the chip module;
    a base located at a periphery of the insulating body, and provided with a first pivoting portion and a second pivoting portion both located behind the insulating body, wherein the first pivoting portion is located between the second pivoting portion and the insulating body;
    a pressing plate configured to press the chip module, and pivotally connected to the second pivoting portion;
    a guide frame pivotally connected to the first pivoting portion, so that the guide frame rotates between a closed position and an open position relative to the base, wherein the guide frame is provided with a limiting section,
    two sliding rails are respectively located on a left side and a right side of the guide frame;
    a carrier located between the pressing plate and the guide frame, configured to carry the chip module onto the insulating body, wherein the carrier is slidably assembled in the sliding rails and rotates along with the guide frame; and
    an engaging portion located behind the limiting section, wherein when the guide frame rotates from the closed position to the open position, the engaging portion abuts the limiting section to limit the guide frame from continuing rotating,
    wherein the base comprises a base plate surrounding the periphery of the insulating body and a metal sheet located behind the insulating body, the second pivoting portion is assembled to the metal sheet, and the engaging portion is arranged on the metal sheet.

6. The electrical connector according to claim 5, wherein the metal sheet is provided with a flat plate portion fixed to the base plate, the flat plate portion is located behind the first pivoting portion, and a front edge of the flat plate portion vertically bends and extends upward to form the engaging portion.

7. The electrical connector according to claim 5, wherein:
    the metal sheet is provided with two second stopping sheets formed by vertically extending upward; the two second stopping sheets are located behind the engaging portions; each of the second stopping sheets is provided with a second through hole, and the second pivoting portion penetrates through the two second through holes;

the pressing plate is provided with a bending portion pivotally connected to the second pivoting portion and located between the two second stopping sheets, so that the two second stopping sheets limit a left-right movement of the pressing plate; and two position limiting sheets are formed by bending and extending opposite to each other from rear edges of the second stopping sheets, the position limiting sheets are located behind the bending portion, and when the pressing plate is opened, the position limiting sheets abut the bending portion.

8. An electrical connector, configured to be electrically connected with a chip module, comprising:
an insulating body;
a plurality of terminals accommodated in the insulating body, and configured to be electrically connected with the chip module;
a base located at a periphery of the insulating body, and provided with a first pivoting portion and a second pivoting portion both located behind the insulating body, wherein the first pivoting portion is located between the second pivoting portion and the insulating body;
a pressing plate configured to press the chip module, and pivotally connected to the second pivoting portion;
a guide frame pivotally connected to the first pivoting portion, so that the guide frame rotates between a closed position and an open position relative to the base, wherein the guide frame is provided with a limiting section,
two sliding rails are respectively located on a left side and a right side of the guide frame;
a carrier located between the pressing plate and the guide frame, configured to carry the chip module onto the insulating body, wherein the carrier is slidably assembled in the sliding rails and rotates along with the guide frame; and an engaging portion located behind the limiting section, wherein when the guide frame rotates from the closed position to the open position, the engaging portion abuts the limiting section to limit the guide frame from continuing rotating,
wherein the base comprises the base plate surrounding the periphery of the insulating body and a metal sheet located behind the insulating body, the first pivoting portion is assembled to the metal sheet, a groove is downward concavely formed on the metal sheet, a torsion spring is sleeved over the first pivoting portion, and the torsion spring is provided with a first abutting portion abutting the guide frame and a second abutting portion downward abutting the groove.

9. The electrical connector according to claim 5, wherein a width of the limiting section in a left-right direction is greater than a width of the engaging portions in the left-right direction.

10. The electrical connector according to claim 5, wherein:
the guide frame comprises a plastic member and a metal member insert-molded in the plastic member;
the plastic member is provided with a rear arm and two side arms formed by extending forward from two opposite sides of the rear arm, and the sliding rails are arranged on the side arms;
a pivoting base is formed by extending backward from the rear arm, and the pivoting base is pivotally connected to the first pivoting portion;
the limiting section protrudes upward from a top surface of the pivoting base; and
the metal member is provided with two opposite first arms, and a second arm and a third arm respectively connected with the two first arms, the first arms are insert-molded in the side arms and extend out of the side arms in a length direction of the first arms, the second arm is insert-molded in the rear arm, and the third arm bends downward from the first arms so as to space away from the carrier when the carrier is assembled to the guide frame.

11. The electrical connector according to claim 10, wherein the base is provided with two vertical first stopping sheets, each of the first stopping sheets is provided with a first through hole, the first pivoting portion penetrates through the two first through holes, and the pivoting base is located between the two first stopping sheets, so that the two first stopping sheets limit a left-right movement of the guide frame, and when the guide frame is located in the closed position, a height of an upper edge of each of the first stopping sheets is between a height of a top surface of the pivoting base and a height of a top surface of the limiting section.

12. The electrical connector according to claim 8, wherein a width of the limiting section in a left-right direction is greater than a width of the engaging portions in the left-right direction.

13. The electrical connector according to claim 8, wherein:
the guide frame comprises a plastic member and a metal member insert-molded in the plastic member;
the plastic member is provided with a rear arm and two side arms formed by extending forward from two opposite sides of the rear arm, and the sliding rails are arranged on the side arms;
a pivoting base is formed by extending backward from the rear arm, and the pivoting base is pivotally connected to the first pivoting portion;
the limiting section protrudes upward from a top surface of the pivoting base; and
the metal member is provided with two opposite first arms, and a second arm and a third arm respectively connected with the two first arms, the first arms are insert-molded in the side arms and extend out of the side arms in a length direction of the first arms, the second arm is insert-molded in the rear arm, and the third arm bends downward from the first arms so as to space away from the carrier when the carrier is assembled to the guide frame.

14. The electrical connector according to claim 13, wherein the base is provided with two vertical first stopping sheets, each of the first stopping sheets is provided with a first through hole, the first pivoting portion penetrates through the two first through holes, and the pivoting base is located between the two first stopping sheets, so that the two first stopping sheets limit a left-right movement of the guide frame, and when the guide frame is located in the closed position, a height of an upper edge of each of the first stopping sheets is between a height of a top surface of the pivoting base and a height of a top surface of the limiting section.

* * * * *